US012481216B2

(12) United States Patent
Huang et al.

(10) Patent No.: US 12,481,216 B2
(45) Date of Patent: Nov. 25, 2025

(54) PHOTORESIST COMPOSITION, OPTICAL FILM THEREOF, AND PREPARING METHOD OF THE OPTICAL FILM

(71) Applicant: eChem Solutions Corp., Taoyuan (TW)

(72) Inventors: Hao Lun Huang, Taoyuan (TW); Yi Sheng Wu, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 0 days.

(21) Appl. No.: 17/680,358

(22) Filed: Feb. 25, 2022

(65) Prior Publication Data

US 2022/0276556 A1 Sep. 1, 2022

(30) Foreign Application Priority Data

Feb. 26, 2021 (TW) ................................. 110107008

(51) Int. Cl.
*G03F 7/033* (2006.01)
*G03F 7/00* (2006.01)

(52) U.S. Cl.
CPC ............ *G03F 7/033* (2013.01); *G03F 7/0005* (2013.01)

(58) Field of Classification Search
None
See application file for complete search history.

(56) References Cited

U.S. PATENT DOCUMENTS

| 2005/0064307 A1* | 3/2005 | Fujimori | G03F 7/0048 430/7 |
| 2015/0125789 A1* | 5/2015 | Park | G03F 7/038 430/18 |
| 2017/0334837 A1* | 11/2017 | Komori | G03F 7/0048 |
| 2018/0017866 A1* | 1/2018 | Kim | G03F 7/033 |
| 2019/0121235 A1* | 4/2019 | Yun | H05K 1/0373 |
| 2019/0386217 A1* | 12/2019 | Arai | G03F 7/0381 |
| 2020/0006414 A1* | 1/2020 | Hamada | G03F 7/027 |

FOREIGN PATENT DOCUMENTS

| CN | 101738857 A | | 6/2010 | |
| CN | 104062848 A | | 9/2014 | |
| CN | 105717742 A | | 6/2016 | |
| CN | 105717743 A | | 6/2016 | |
| CN | 105717747 A | | 6/2016 | |
| CN | 106233203 A | | 12/2016 | |
| JP | 2016143062 A | * | 8/2016 | ........... G03F 7/0007 |
| TW | 200914896 A | | 4/2009 | |
| TW | 200914956 A | | 4/2009 | |
| TW | 201609984 A | | 3/2016 | |
| TW | 201638676 A | | 11/2016 | |

OTHER PUBLICATIONS

Translated Description of Hun, JP-2016143062-A (Year: 2016).*
Ingrid F. Guha, Effects of Silica Nanoparticle Treatment and Average Diameter on the Physical and Mechanical Properties of Poly(dimethylsiloxane)-Silica Nanocomposites, 2010, Massachusetts Institute of Technology Dept. of Materials Science and Engineering. (Year: 2010).*
Translated Description of Yoshihiko et al JP 200807954 (incorporated by reference into Hamada) (Year: 2008).*

* cited by examiner

*Primary Examiner* — Jonathan Johnson
*Assistant Examiner* — Andrew Preston Traywick

(57) ABSTRACT

The present disclosure provides a photoresist composition comprising an alkali soluble resin, a photopolymerizable compound, a photoinitiator, a thermal initiator, a black colorant, and a solvent, wherein the photopolymerizable compound contains at least one ethylenically unsaturated monomer and at least one epoxy compound. The present disclosure also provides an optical film and a preparing method of the optical film.

18 Claims, No Drawings

PHOTORESIST COMPOSITION, OPTICAL FILM THEREOF, AND PREPARING METHOD OF THE OPTICAL FILM

FIELD OF THE INVENTION

The present invention relates to a photoresist composition, and more particularly to a photoresist composition which may be used in a low-temperature process, and an optical film and a preparing method of the optical film.

BACKGROUND OF THE INVENTION

Generally, a patterned light-shielding film such as a black matrix or a black column spacer is formed in a display device. The photosensitive composition for forming a light-shielding film contains raw materials such as an adhesive, a colorant, and a photopolymerizable compound. In recent years, flexible display devices are developed, which use flexible substrates instead of glass substrates. Most flexible substrates contain organic raw materials (such as plastic film materials). Because heat resistance of the plastic substrate is lower than that of the glass substrate, it is necessary to lower the thermal curing temperature of the photosensitive composition. In addition, firstly, chemical resistance and mechanical properties of the light-shielding film should meet the requirements, and secondly, a catalyst is usually used at a lower thermal curing temperature. However, it is known that the catalysts often have poor solubility, resulting in foreign matter and poor compatibility with photosensitive composition.

SUMMARY OF THE INVENTION

One of the objectives of several embodiments of this invention is to provide a photoresist composition that can be used in a low-temperature process.

Another objective of several embodiments of this invention is to provide an optical film prepared by a low-temperature process, wherein the optical film has appropriate light transmittance, good chemical resistance and mechanical properties.

In some embodiments of this invention, the photoresist composition includes an (A) alkali-soluble resin; a (B) photopolymerizable compound; a (C) photoinitiator; a (D) thermal initiator; a (E) black colorant; and a (F) solvent; wherein the (B) photopolymerizable compound comprises at least one ethylenically unsaturated monomer and at least one epoxy compound.

In an embodiment of this invention, the above-mentioned (A) alkali-soluble resin is an acrylic resin and has a weight average molecular weight of 2,000 to 50,000.

In an embodiment of this invention, the above-mentioned (A) alkali-soluble resin is composed of the monomer with structures represented by the following Formulas i, ii, iii, iv and v.

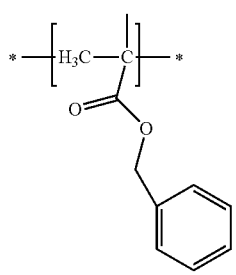

i

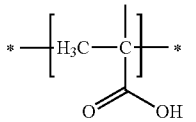

ii

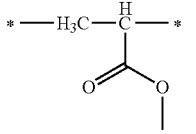

iii

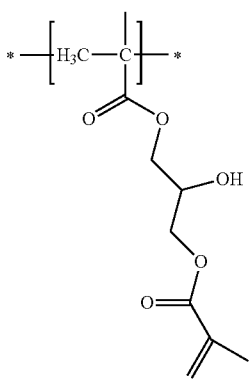

iv

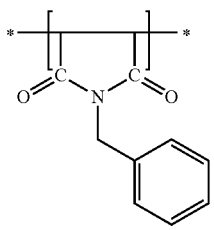

v

In an embodiment of this invention, the above-mentioned at least one epoxy compound further has a structure represented by Formula (II), wherein R' and R" in Formula (II) are the same or different from each other, and each of R' and R" independently is hydrogen, hydroxyl group, C1-C10 alkyl group, C1-C10 alkoxyl group or —$(R_a)_n$—$R_b$, and at least one of R' and R" is —$(R_a)_n$—$R_b$; wherein $R_a$ is hydrogen, C1-C10 alkylidene group, —$R_5$—O—$R_6$— or —$R_7$—C(=O)O—$R_8$—, and $R_5$-$R_8$ are the same or different with each other, and each of $R_5$-$R_8$ independently is C1-C10 alkylidene group; wherein $R_b$ is hydrogen, sulfhydryl group, isocyanate group, carboxyl group, hydroxyl group, amino group, carbamido group, carbamate group, (methyl)acrylate group, C1-C10 alkyl group, C1-C10 alkoxyl group, C3-C15 cycloalkyl group, C3-C15 heterocloalkyl group, C6-C20 aryl group or C5-C20 heteroaryl group; wherein x is an integer of 1-500; wherein y is an integer of 1-500; wherein n is an integer of 0 or 1

$$(R'SiO1.5)x(R''SiO1.5)y \qquad (II).$$

In an embodiment of this invention, the above-mentioned (B) photopolymerizable compound includes dipentaerythritol hexaacrylate (DPHA) and organic-inorganic hybrid resin.

In an embodiment of this invention, the above-mentioned organic-inorganic hybrid resin is a hybrid resin formed by mixing nanosilica into the resin.

In an embodiment of this invention, the above-mentioned (B) photopolymerizable compound further includes a polyfunctional polyurethane acrylate.

In an embodiment of this invention, a weight ratio of the above-mentioned at least one ethylenically unsaturated monomer to the at least one epoxy compound is between 1:5 and 5:1.

In an embodiment of this invention, the above-mentioned (C) photoinitiator is an oxime ester-based photoinitiator and the (D) thermal initiator is an ionic thermal acid initiator.

In an embodiment of this invention, the above-mentioned (E) black colorant includes an organic black pigment.

In an embodiment of this invention, the above-mentioned (F) solvent includes a compound with a structure represented by Formula (III), wherein $R_3$ and $R_4$ may be linking groups of ethers, alcohols, or acetates

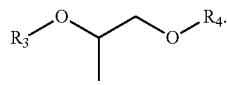

(III)

In an embodiment of this invention, the above-mentioned (F) solvent is propylene glycol monomethyl ether acetate (PGMEA).

In an embodiment of this invention, the above-mentioned composition may further comprise an additive, and the additive may include a fluorine-based surfactant.

Several embodiments of this invention also provide an optical film, which is prepared by the above-mentioned photoresist composition and has a transmittance of less than or equal to 2% for a light with a wavelength of 380 to 700 nm, and a transmittance of greater than or equal to 80% for a light with a wavelength of 850 nm and a light with a wavelength of 940 nm.

In an embodiment of this invention, the above-mentioned optical film further has an optical density of not less than 3 and a thickness of 2±0.1 μm.

Several embodiments of this invention further provide a preparing method of an optical film which comprises the following steps: coating the above-mentioned photoresist composition to a substrate; heating the photoresist composition at a first temperature and forming a film layer; patterning the film layer; and heating the film layer at a second temperature and forming the optical film, wherein the optical film has a transmittance of less than or equal to 2% for a light with a wavelength of 380 to 700 nm and a transmittance of greater than or equal to 80% for a light with a wavelength of 850 nm and a light with a wavelength of 940 nm.

In an embodiment of this invention, the above-mentioned step of patterning the film layer further includes performing exposure and development on the film layer.

In an embodiment of this invention, the above-mentioned step of heating the film layer at the second temperature includes heating the film layer at a temperature of less than 150° C. and greater than 90° C.

In an embodiment of this invention, the above-mentioned step of heating the film layer at the second temperature further includes heating the film at 120° C. for 30 minutes and forming the optical film with a thickness of 2±0.1 μm.

In an embodiment of this invention, the above-mentioned second temperature and the first temperature are not greater than 120° C.

Because this invention uses the (B) photopolymerizable compound which includes the at least one ethylenically unsaturated monomer and the at least one epoxy compound, the optical film having chemical resistance and mechanical properties may be formed at a temperature of not exceeding 150° C. without adding a catalyst after light curing and thermal curing.

DETAILED DESCRIPTION OF PREFERRED EMBODIMENTS

This invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The low temperature mentioned in this disclosure is not particularly limited unless otherwise defined. However, the low temperature is less than or equal to 170° C., preferably 90-150° C. The high temperature is greater than 170° C., preferably 200-240° C.

This invention provides a photoresist composition which may be used in a low-temperature process. The photoresist composition of this invention includes an (A) alkali-soluble resin, a (B) photopolymerizable compound, a (C) photoinitiator, a (D) thermal initiator, a (E) black colorant and a (F) solvent. The (A) alkali soluble resin may be acrylic resin composed of polymerizable monomers of acrylic acids and derivatives thereof, and preferably has a weight average molecular weight of 2,000 to 50,000. The (B) photopolymerizable compound includes at least one ethylenically unsaturated monomer and at least one epoxy compound, wherein the at least one epoxy compound may react with the (D) thermal initiator.

(A) Alkali-Soluble Resin

The (A) alkali-soluble resin in several embodiments of this invention is not particularly limited, but may be benzyl (meth)acrylate, methyl(meth)acrylate, ethyl(meth)acrylate, butyl(meth)acrylate, dimethylaminoethyl(meth)acrylate, isobutyl(meth)acrylate, t-butyl(meth)acrylate, cyclohexyl (meth)acrylate, isobornyl(meth)acrylate, ethylhexyl(meth) acrylate, 2-phenoxyethyl(meth)acrylate, tetrahydrofurfuryl (meth)acrylate, hydroxyethyl(meth)acrylate, 2-hydroxypropyl(meth)acrylate, 2-hydroxy-3-chloropropyl (meth)acrylate, 4-hydroxybutyl(meth)acrylate, glycerol (meth)acrylate, 2-methoxybutyl (meth)acrylate, 3-methoxybutyl(meth)acrylate, ethoxydiethyleneglycol(meth)acrylate, methoxytriethyleneglycol(meth)acrylate, methoxytripropyleneglycol(meth)acrylate, poly(ethyleneglycol)methylether (meth)acrylate, phenoxydiethyleneglycol(meth)acrylate, p-nonylphenoxypolyethyleneglycol(meth)acrylate, p-nonylphenoxypolypropyleneglycol(meth)acrylate, glycidyl (meth)acrylate, dicyclopentanyl(meth)acrylate, dicyclopentenyl(meth)acrylate, dicyclopentenyloxyethyl(meth) acrylate, adamantyl(meth)acrylate, stearyl(meth)acrylate, hexyl(meth)acrylate, heptyl(meth)acrylate, octyl(meth)acrylate, nonyl(meth)acrylate, decyl(meth)acrylate, lauryl(meth) acrylate, methyl α-hydroxymethyl acrylate, ethyl α-hydroxymethyl acrylate, propyl α-hydroxymethyl acrylate, butyl α-hydroxymethyl acrylate and so on. In an embodiment of this invention, the (A) alkali-soluble resin may be composed of monomers with structures represented by the following Formulas i, ii, iii, iv and v

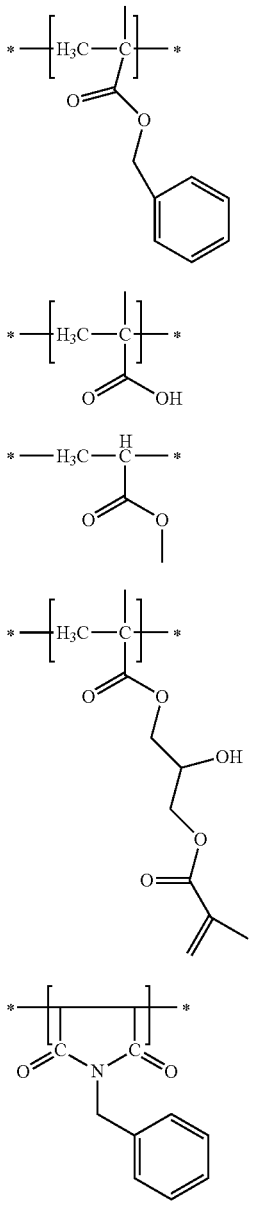

(B) Photopolymerizable Compound

The (B) photopolymerizable compound in several embodiments of this invention is not particularly limited, but preferably may include at least one ethylenically unsaturated monomer and at least one epoxy compound. In several embodiments of this invention, a weight ratio of the at least one ethylenically unsaturated monomer to the at least one epoxy compound may be between 1:5 and 5:1. In other embodiments of this invention, it may be between 1:2 and 2:1. In a further embodiment of this invention, it may be 1:1.

The epoxy compound is not particularly limited, and may be, for example, bisphenol type epoxy resin, novolac type epoxy resin, glycidyl ester type epoxy resin, glycidyl amine type epoxy resin, linear aliphatic epoxy resin, alicyclic epoxy resin, biphenyl epoxy resin and so on. In an embodiment of this invention, the epoxy compound may be a siloxane compound with a structure represented by the following Formula (II), wherein R' and R" are the same or different from each other, and each of R' and R" independently is hydrogen, hydroxyl, C1-C10 alkyl group, C1-C10 alkoxy group or $-(R_a)_n-R_b$, and at least one of the above R' and R" is $-(R_a)_n-R_b$; in this case, $R_a$ is hydrogen, C1-C10 alkylidene group, $-R_5-O-R_6-$ or $-R_7-C(=O)O-R_8-$, and $R_5$-$R_8$ are the same or different from each other, and each of $R_5$-$R_8$ independently is C1-C10 alkylidene group; wherein $R_b$ is hydrogen, sulfhydryl group, isocyanate group, carboxyl group, hydroxyl group, amino group, carbamido group, carbamate group, (methyl)acrylate group, C1-C10 alkyl group, C1-C10 alkoxy group, C3-C15 cycloalkyl group, C3-C15 heterocycloalkyl group, C6-C20 aryl group or C5-C20 heteroaryl group; wherein x is an integer of 1-500; wherein y is an integer of 1-500; wherein n is an integer of 0 or 1. Furthermore, the (B) photopolymerizable compound may include an organic-inorganic hybrid resin containing the epoxy compound, and preferably, it may be a hybrid resin formed by mixing nanosilica into the resin $$(R'SiO1.5)x(R''SiO1.5)y \tag{II}$$

The ethylenically unsaturated monomer of the (B) photopolymerizable compound in several embodiments of this invention is not particularly limited, and may be, for example, polyethyleneglycol mono(meth)acrylate, polypropyleneglycol mono(meth)acrylate, phenoxyethyl(meth)acrylate, polyethyleneglycol(meth)acrylate, polypropyleneglycol(meth)acrylate, trimethylolethane triacrylate, trimethylolpropane triacrylate, neopentylglycol(meth)acrylate, pentaerythritol tetraacrylate, pentaerythritol triacrylate, dipentaerythritol pentaacrylate, dipentaerythritol hexaacrylate and so on.

(C) Photoinitiator

The (C) photoinitiator in several embodiments of this invention is not particularly limited and may be, for example, acetophenone-based compound, biimidazole-based compound, triazine-based compound, oxime ester-based compound and so on. In several embodiments of this invention, the (C) photoinitiator may preferably be an oxime compound, e.g., 1,2-octadione-1-(4-phenylthio)phenyl-2-(o-benzoyloxime), ethanone-1-(9-ethyl)-6-(2-methylbenzoyl-3-yl)-1-(o-acetyloxime), N-1919 (Adeka), OXE-01, OXE-02, OXE-03.

(D) Thermal Initiator

The (D) thermal initiator in several embodiments of this invention is not particularly limited, and any suitable thermal initiator may be used, such as an ionic thermal acid initiator or a thermal radical initiator. The thermal initiator may include, but is not limited to, a thermally activated curing agent for epoxy groups, which can release strong acids at a high temperature to catalyze crosslinking reaction of epoxy groups. The thermal acid initiator may be, for example, any onium salt having $BF_4^-$, $PF_6^-$, $SbF_6^-$, $CF_3SO_3^-$, and $(C_6F_5)_4B^-$ type composite anions, e.g., sulfonium salts and iodonium salts. The thermal acid initiators may be selected from K-PURE, CXC-1612, CXC-1614, TAG-2172, TAG-2179, TAG-2678, TAG-2689 (manufactured by King Industries, Inc.), and SI-45, SI-60, SI-80, SI-100, SI-110, SI-150 (manufactured by Sanshin Chemical Industry Co., Ltd.).

(E) Black Colorant

The (E) black colorant in several embodiments of this invention is not particularly limited, and may include carbon black, black pigment, or a combination thereof, and may further include color pigments. The black pigments are organic black pigments, e.g., lactam black, aniline black, and perylene black pigments. In an embodiment of this invention, the black pigment is a perylene black pigment. The (E) black colorant preferably imparts better light-shielding properties, low electrical conductivity, and good transmittance for a light near infrared light region to the photoresist composition and the optical film made therefrom.

(F) Solvent

The (F) solvent in several embodiments of this invention is not particularly limited, and may be one type or a mixture of two or more types. In an embodiment of this invention, the (F) solvent includes a compound with a structure represented by Formula (III), wherein $R_3$ and $R_4$ may be linking groups of ethers, alcohols, or acetates

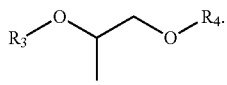
(III)

The photoresist composition of the embodiment of this invention may further comprise one or more additives, e.g., a surfactant, a dispersant, an antioxidant, an ultraviolet light absorber, a thermal polymerization inhibitor, a leveling agent and so on. In an embodiment of this invention, the surfactant used is a fluorine-based surfactant.

As shown in Table 1 below, Examples 1 to 5 illustrate components and contents of the photoresist composition of this invention, wherein a ratio of the ethylenically unsaturated monomer to the epoxy compound may be between 5:1 and 1:5, the (C) photoinitiator may be selected from OXE series.

TABLE 1

Photoresist composition in Examples 1-5

| Components | Types | Examples 1 | 2 | 3 | 4 | 5 |
|---|---|---|---|---|---|---|
| (A) Alkali soluble resin (Parts by weight) | Acrylic resin | 6.2 | 6.2 | 6.2 | 6.2 | 6.2 |
| (B) Photopolymerizable compound (Parts by weight) | DPHA | 2.5 | 2 | 1.5 | 1 | 0.5 |
|  | Organic-inorganic hybrid resin SQ506 (Arakawa Chemical) | 0.5 | 1 | 1.5 | 2 | 2.5 |
| (C) Photoinitiator (Parts by weight) | OXE series | 0.6 | 0.6 | 0.6 | 0.6 | 0.6 |
| (D) Thermal initiator (Parts by weight) | Ionic thermal acid | 0.07 | 0.07 | 0.07 | 0.07 | 0.07 |
| (E) Black colorant (Parts by weight) | Organic black | 8.1 | 8.1 | 8.1 | 8.1 | 8.1 |
|  | Carbon black | — | — | — | — | — |
|  | Pigment red (R254) | — | — | — | — | — |
|  | Pigment yellow (Y139) | — | — | — | — | — |
|  | Pigment blue (B156) | — | — | — | — | — |
|  | Pigment purple (V23) | — | — | — | — | — |
| (F) Solvent (Parts by weight) | PGMEA | 82 | 82 | 82 | 82 | 82 |
| Total parts by weight |  | 100 | 100 | 100 | 100 | 100 |

Photoresist compositions illustrated in Comparative Examples 1 to 5 are further prepared. The differences between Comparative Examples 1-5 and this invention are mainly in composition of the (B) photopolymerizable compound (Comparative Examples 1-2, 4-5) and composition of the colorant (Comparative Examples 2-5), as shown in Table 2 below.

TABLE 2

Photoresist composition in Comparative Examples 1-5

| Components | Types | Comparative Examples 1 | 2 | 3 | 4 | 5 |
|---|---|---|---|---|---|---|
| (A) Alkali soluble resin (Parts by weight) | Acrylic resin | 6.2 | 4.95 | 4.95 | 4.95 | 6.72 |
| (B) Photopolymerizable compound (Parts by weight) | DPHA | 3 | 4.77 | 2.86 | 4.77 | 3 |
|  | Organic-inorganic hybrid resin SQ506 (Arakawa Chemical) | — | — | 1.91 | — | — |
| (C) Photoinitiator (Parts by weight) | OXE series | 0.6 | 0.95 | 0.95 | 0.95 | 0.84 |
| (D) Thermal initiator (Parts by weight) | Ionic thermal acid | 0.07 | 0.1 | 0.1 | 0.1 | 0.21 |
| (E) Black colorant (Parts by weight) | Organic black | 8.1 | 6.48 | 6.48 | — | — |
|  | Carbon black | — | 0.72 | 0.72 | 7.2 | — |
|  | Pigment red (R254) | — | — | — | — | 1.44 |
|  | Pigment yellow (Y139) | — | — | — | — | 1.44 |
|  | Pigment blue (B156) | — | — | — | — | 3.02 |
|  | Pigment purple (V23) |  |  |  |  | 1.3 |

TABLE 2-continued

Photoresist composition in Comparative Examples 1-5

| Components | Types | Comparative Examples | | | | |
|---|---|---|---|---|---|---|
| | | 1 | 2 | 3 | 4 | 5 |
| (F) Solvent (Parts by weight) | PGMEA | 82 | 82 | 82 | 82 | 82 |
| Total parts by weight | | 100 | 100 | 100 | 100 | 100 |

Several embodiments of this invention further provide an optical film made from the above-mentioned photoresist composition, and a preparing method of the optical film which includes the following steps: coating the above-mentioned photoresist composition to a substrate; heating the photoresist composition at a first temperature and forming a film layer; patterning the film layer; and heating the film layer at a second temperature and forming the optical film, wherein the patterning step includes performing exposure and development on the film layer. The first temperature is not greater than 170° C., preferably not greater than 150° C., and more preferably not greater than 120° C. or lower (e.g., not greater than 90° C.). The second temperature is not greater than 170° C., more preferably not greater than 150° C. In an embodiment of this invention, the step of heating at the second temperature includes heating the film layer at a temperature of less than 150° C. and greater than 90° C., for example, heating the film layer at 120° C. for 30 minutes. After completion, the optical film with a thickness of 2±0.1 μm may be formed. The following Example 6 illustrates the preparing method of the optical film of this invention.

Example 6: Preparing Method of the Optical Film

The photoresist compositions of Examples 1 to 5 are spin-coated respectively to substrates, and then the substrates are placed on a heating plate for 2 minutes to form film layers respectively on the substrates, wherein the heating plate is maintained at 90° C. The substrate may be of glass or of plastic. The exposure is then performed. A mask is place above the film layer, and then the film layer and the mask are exposed to ultraviolet light. The mask used in this embodiment has a specification/characteristic of 1-50 μm line/space pattern and the pattern has transmittance which gradually changes in a range of 1%-100%. The exposure to ultraviolet light is performed by a 1 kW high-pressure mercury lamp under 200 mJ/cm$^2$ and an interval of 200 μm, without any special optical filter, and the mercury lamp contains all of g, h and i lines.

In this embodiment, an aqueous KOH solution (0.045%) is used as a developer, and the exposed film layer is immersed in the developer for 60 seconds. After development, the film layer is washed with distilled water and dried with nitrogen, and then heated in an oven set at 120° C. for 30 minutes to obtain the optical film of this invention. The compositions of Comparative Examples 1 to 5 are made into optical films in the same way.

This invention further evaluates the respective optical films made from the compositions of Examples 1 to 5 and Comparative Examples 1 to 5. The evaluation items includes: optical film thickness, transmittance, optical density, chemical resistance and mechanical properties. The following Example 7 illustrates methods of evaluation and presents evaluation results of each optical film.

Example 7: Evaluations Methods and Results

Optical film thickness: The obtained optical film is measured by a contact film thickness meter Alpha step (manufactured by Veeco) and confirmed to have a thickness of 2±0.1 μm.

Transmittance: transmittance of a wavelength of 200-1,100 nm is confirmed by means of a visible light photometer (U-2900 HITACHI). When transmittance for visible light of 380-700 nm is ≤ (less than or equal to) 2%, and transmittance for infrared light of 850 nm and 940 nm is ≥ (greater than or equal to) 80%, it is rated as ◯. When transmittance for visible light of 380-700 nm is > (greater than) 2%, or transmittance for infrared light of 850 nm and 940 nm is < (less than) 80%, it is rated as X.

Optical density: OD value (Optical Density) is measured by means of an optical densitometer. Those with OD≥3.0 are rated as ◯, and those with OD<3.0 are rated as X.

Chemical resistance: chemical resistance is evaluated by means of wiping the film layer with alcohol. Those without residual color after alcohol wipe 50 times back and forth are rated as ◯, those with slight residual color after alcohol wipe 50 times back and forth are rated as Δ, and those with heavy residual color after alcohol wipe 50 times back and forth are rated as X.

Mechanical properties: mechanical properties are evaluated by means of a semi-automatic pencil hardness tester. The evaluation results of the optical films made from each photoresist composition are shown in Table 3 below.

TABLE 3

| | Photoresist compositions | | | | | | | | | |
|---|---|---|---|---|---|---|---|---|---|---|
| | Examples | | | | | Comparative Examples | | | | |
| | 1 | 2 | 3 | 4 | 5 | 1 | 2 | 3 | 4 | 5 |
| Transmittance | ◯ | ◯ | ◯ | ◯ | ◯ | ◯ | X | X | X | ◯ |
| Optical density | ◯ | ◯ | ◯ | ◯ | ◯ | ◯ | ◯ | ◯ | ◯ | X |
| Chemical resistance | ◯ | ◯ | ◯ | ◯ | ◯ | X | X | ◯ | X | X |
| Mechanical properties | 3H | 3H | 3H | 3H | 3H | 2H | 2H | 3H | 2H | 2H |

With reference to Tables 1 to 3, the optical films made from the photoresist composition of several embodiments of this invention at the temperature of less than 150° C. and without the catalyst have a thickness of 2±0.1 μm and pass tests of transmittance, optical density, chemical resistance, and mechanical properties. In several embodiments of this invention, the epoxy compound may react with the (D) thermal initiator, thereby imparting sufficient chemical resistance and mechanical properties to the optical films of several embodiments of this invention. On the contrary, even if an amount of the photopolymerizable compound of the ethylenically unsaturated monomer is increased, Comparative Examples cannot achieve the effect as the several embodiments of this invention do under the same preparing conditions. In several embodiments of this invention, the organic black pigment may give the optical films the optical density of greater than or equal to 3.0, the transmittance for visible light of the wavelength of 380-700 nm less than or equal to 2%, and the transmittance for infrared light of the wavelength of 850-940 nm greater than or equal to 80%. Accordingly, this invention is suitable for a variety of substrates and may be used as photoresist elements such as traditional glass substrates and organic flexible film materials.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A photoresist composition for low-temperature processes, comprising:
   an (A) alkali soluble resin;
   a (B) photopolymerizable compound;
   a (C) photoinitiator;
   a (D) thermal initiator; wherein the (D) thermal initiator is capable of releasing strong acids at a temperature;
   a (E) black colorant; wherein the (E) black colorant is an organic black colorant consisting of at least one organic black pigment selected from a group consisting of lactam black, aniline black, and perylene black pigments; and
   a (F) solvent,
   wherein the (B) photopolymerizable compound comprises at least one ethylenically unsaturated monomer and at least one epoxy compound;
   wherein a weight ratio of the at least one ethylenically unsaturated monomer to the at least one epoxy compound is between 1:5 and 5:1;
   wherein the ethylenically unsaturated monomer is selected from the group consisting of polyethyleneglycol mono(meth)acrylate, polypropyleneglycol mono(meth)acrylate, phenoxyethyl(meth)acrylate, polyethyleneglycol (meth)acrylate, polypropyleneglycol(meth)acrylate, trimethylolethane triacrylate, trimethylolpropane triacrylate, neopentylglycol(meth)acrylate, pentaerythritol tetraacrylate, pentaerythritol triacrylate, dipentaerythritol pentaacrylate and dipentaerythritol hexaacrylate, and
   the at least one epoxy compound further has a structure represented by Formula (II), wherein R' and R" in Formula (II) are the same or different from each other, and each of R' and R" independently is hydrogen, hydroxyl group, C1-C10 alkyl group, C1-C10 alkoxyl group or —$(R_a)_n$—$R_b$, and at least one of R' and R" is —$(R_a)_n$—$R_b$; wherein $R_a$ is hydrogen, C1-C10 alkylidene group, —$R_5$—O—$R_6$— or —$R_7$—C(=O)O—$R_8$—, and $R_5$-$R_8$ are the same or different from each other, and each of $R_5$-$R_8$ independently is C1-C10 alkylidene group; wherein $R_b$ is hydrogen, sulfhydryl group, isocyanate group, carboxyl group, hydroxyl group, amino group, carbamido group, carbamate group, (methyl)acrylate group, C1-C10 alkyl group, C1-C10 alkoxyl group, C3-C15 cycloalkyl group, C3-C15 heterocycloalkyl group, C6-C20 aryl group or C5-C20 heteroaryl group; wherein x is an integer of 1-500; wherein y is an integer of 1-500; wherein n is an integer of 0 or 1;

wherein the strong acid released from the thermal initiator is capable of catalyzing a crosslinking reaction of the at least one epoxy group of the at least one epoxy compound;
   wherein the low-temperature is less than or equal to 150° C., and
   the photoresist composition for low-temperature processes is adapted for making an optical film, and the optical film made from the photoresist composition for low-temperature processes has:
   a transmittance of less than or equal to 2% for a light with a wavelength of 380 to 700 nm and a transmittance of greater than or equal to 80% for a light with a wavelength of 850 nm and a light with a wavelength of 940 nm;
   an OD value of greater than or equal to 3.0;
   chemical resistance, wherein the optical film has no residual color after being wiped with alcohol 50 times back and forth; and
   mechanical properties, wherein the optical film has a semi-automatic pencil hardness of greater than or equal to 3H.

2. The photoresist composition for low-temperature processes according to claim 1, wherein the (A) alkali soluble resin is acrylic resin and has a weight average molecular weight of 2,000 to 50,000.

3. The photoresist composition for low-temperature processes according to claim 2, wherein the (A) alkali soluble resin is composed of monomers selected from the group consisting of a monomer with a structure represented by Formula i, a monomer with a structure represented by Formula ii, a monomer with a structure represented by Formula iii, a monomer with a structure represented by Formula iv, and a monomer with a structure represented by Formula v as follows

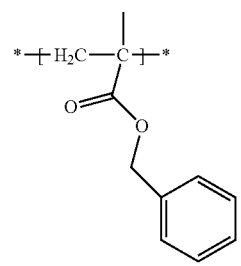

i

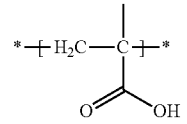

ii

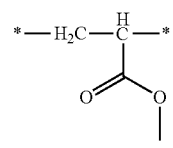

iii $(R'SiO_{1.5})_x(R''SiO_{1.5})_y$ (II);

-continued

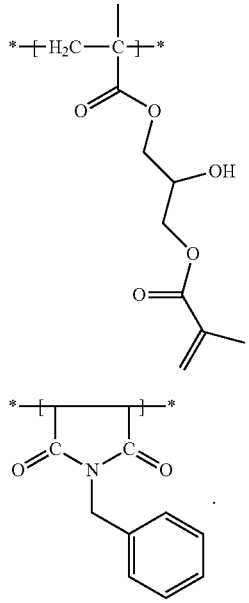

4. The photoresist composition for low-temperature processes according to claim 1, wherein the (B) photopolymerizable compound includes dipentaerythritol hexaacrylate and an organic-inorganic hybrid resin.

5. The photoresist composition for low-temperature processes according to claim 4, wherein the organic-inorganic hybrid resin is a hybrid resin formed by mixing nanosilica into the resin.

6. The photoresist composition for low-temperature processes according to claim 1, wherein the (B) photopolymerizable compound further includes polyfunctional polyurethane acrylate.

7. The photoresist composition for low-temperature processes according to claim 1, wherein the (C) photoinitiator is an oxime ester-based photoinitiator and the (D) thermal initiator is an ionic thermal acid initiator.

8. The photoresist composition for low-temperature processes according to claim 1, wherein the (E) black colorant includes an organic black pigment.

9. The photoresist composition for low-temperature processes according to claim 1, wherein the (F) solvent includes a compound with a structure represented by Formula (III), wherein $R_3$ and $R_4$ are linking groups of ethers, alcohols or acetic esters

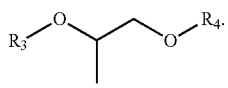

(III)

10. The photoresist composition for low-temperature processes according to claim 9, wherein the (F) solvent is propylene glycol monomethyl ether acetate.

11. The photoresist composition for low-temperature processes according to claim 1, further comprising an additive, wherein the additive comprises at least one fluorine-based surfactant.

12. An optical film, made from a photoresist composition for low-temperature processes of claim 1, and having a transmittance of less than or equal to 2% for a light with a wavelength of 380 to 700 nm and a transmittance of greater than or equal to 80% for a light with a wavelength of 850 nm and a light with a wavelength of 940 nm.

13. The optical film according to claim 12, wherein the optical film further has an optical density of not less than 3 and a thickness of 2±0.1 μm.

14. A preparing method of an optical film, comprising steps of:
coating a photoresist composition for low-temperature processes of claim 1 to a substrate;
heating the photoresist composition for low-temperature processes at a first temperature and forming a film layer;
patterning the film layer; and
heating the film layer at a second temperature and forming the optical film, wherein the optical film has:
a transmittance of less than or equal to 2% for a light with a wavelength of 380 to 700 nm and a transmittance of greater than or equal to 80% for a light with a wavelength of 850 nm and a light with a wavelength of 940 nm;
an OD value of greater than or equal to 3.0;
chemical resistance, wherein the optical film has no residual color after being wiped with alcohol 50 times back and forth; and
mechanical properties, wherein the optical film has a semi-automatic pencil hardness of greater than or equal to 3H.

15. The preparing method of an optical film according to claim 14, wherein the step of patterning the film layer further comprises a step of: performing exposure and development on the film layer.

16. The preparing method of an optical film according to claim 14, wherein the step of heating the film layer at the second temperature further comprises a step of:
heating the film layer at a temperature of less than 150° C. and greater than 90° C.

17. The preparing method of an optical film according to claim 16, wherein the step of heating the film layer further comprises a step of: heating the film layer at 120° C. for 30 minutes and forming the optical film with a thickness of 2±0.1 μm.

18. The preparing method of an optical film according to claim 14, wherein the second temperature and the first temperature are not greater than 120° C.

* * * * *